United States Patent
Kim et al.

(10) Patent No.: US 12,198,901 B2
(45) Date of Patent: Jan. 14, 2025

(54) METHOD FOR CLEANING CHAMBER OF SUBSTRATE PROCESSING APPARATUS

(71) Applicant: JUSUNG ENGINEERING CO., LTD., Gwangju-Si (KR)

(72) Inventors: Yong Hyun Kim, Gwangju-Si (KR); Yoon Jeong Kim, Gwangju-Si (KR); Chang Kyun Park, Gwangju-Si (KR); Jae Wan Lee, Gwangju-Si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 413 days.

(21) Appl. No.: 17/623,876

(22) PCT Filed: Jul. 7, 2020

(86) PCT No.: PCT/KR2020/008856
§ 371 (c)(1),
(2) Date: Dec. 29, 2021

(87) PCT Pub. No.: WO2021/006600
PCT Pub. Date: Jan. 14, 2021

(65) Prior Publication Data
US 2022/0367152 A1 Nov. 17, 2022

(30) Foreign Application Priority Data

Jul. 8, 2019 (KR) .................. 10-2019-0082262

(51) Int. Cl.
*H01J 37/32* (2006.01)
*B08B 7/00* (2006.01)
(Continued)

(52) U.S. Cl.
CPC ...... *H01J 37/32477* (2013.01); *B08B 7/0035* (2013.01); *B08B 9/08* (2013.01);
(Continued)

(58) Field of Classification Search
CPC .......... H01J 37/32477; H01J 37/32862; B08B 2209/08; B08B 9/08
See application file for complete search history.

(56) References Cited

U.S. PATENT DOCUMENTS 5,468,686 A * 11/1995 Kawamoto ....... H01J 37/32862
438/720
6,401,728 B2 * 6/2002 Chow ............... H01J 37/32862
134/1.1
(Continued)

FOREIGN PATENT DOCUMENTS

EP 0702098 A1 * 3/1996 ............. H01J 37/32
EP 1065295 A1 * 1/2001 ............. C23C 16/44
(Continued)

OTHER PUBLICATIONS

Cunge, G., et al., "New chamber walls conditioning and cleaning strategies to improve the stability of plasma processes". Plasma Sources Science and Technology, vol. 14, No. 3, pp. 599-609.*
(Continued)

*Primary Examiner* — Bret P Chen
(74) *Attorney, Agent, or Firm* — Renaissance IP Law Group LLP

(57) ABSTRACT

A chamber cleaning method in accordance with an exemplary embodiment includes a chamber stabilizing process for transporting a substrate, on which a thin film deposition process has been completed, out of a chamber and processing an inside of the chamber, wherein the chamber stabilizing process includes: a cleaning process for injecting a cleaning gas into the chamber and etching and cleaning byproducts generated by the thin film deposition; and a coating process for injecting a gas including at least one among aluminum (Al), zirconium (Zr) or hafnium (Hf) into the chamber, and generating a protective film on an inner
(Continued)

wall of the chamber and at least one surface of components installed inside the chamber.

10 Claims, 3 Drawing Sheets

(51) Int. Cl.
| | |
|---|---|
| *B08B 9/08* | (2006.01) |
| *C23C 16/40* | (2006.01) |
| *C23C 16/44* | (2006.01) |
| *C23C 16/505* | (2006.01) |
| *H01L 29/786* | (2006.01) |

(52) U.S. Cl.
CPC .......... *C23C 16/403* (2013.01); *C23C 16/405* (2013.01); *C23C 16/4404* (2013.01); *C23C 16/4405* (2013.01); *C23C 16/505* (2013.01); *H01J 37/32862* (2013.01); *B08B 2209/08* (2013.01); *H01L 29/7869* (2013.01)

(56) References Cited

U.S. PATENT DOCUMENTS

| | | | | |
|---|---|---|---|---|
| 6,841,008 | B1* | 1/2005 | Branco | H01J 37/32862 |
| | | | | 134/1.1 |
| 7,288,284 | B2* | 10/2007 | Li | C23C 16/4404 |
| | | | | 427/249.15 |
| 2002/0096188 | A1 | 7/2002 | Nogami | |
| 2002/0146512 | A1* | 10/2002 | Rossman | H01J 37/32477 |
| | | | | 427/255.393 |
| 2003/0127049 | A1* | 7/2003 | Han | C23C 16/4404 |
| | | | | 427/523 |
| 2003/0198749 | A1* | 10/2003 | Kumar | H01J 37/32642 |
| | | | | 118/723 R |
| 2003/0211735 | A1* | 11/2003 | Rossman | H01L 21/31612 |
| | | | | 257/E21.279 |
| 2004/0123879 | A1 | 7/2004 | Yim et al. | |
| 2004/0200498 | A1 | 10/2004 | Wang et al. | |
| 2006/0091104 | A1 | 5/2006 | Takeshita et al. | |
| 2007/0128877 | A1* | 6/2007 | White | C23C 16/4404 |
| | | | | 438/725 |
| 2008/0110760 | A1* | 5/2008 | Han | C23C 30/005 |
| | | | | 204/279 |
| 2008/0118663 | A1* | 5/2008 | Choi | C23C 16/4404 |
| | | | | 427/255.28 |
| 2012/0040536 | A1* | 2/2012 | Furuta | C23C 16/4404 |
| | | | | 438/791 |
| 2013/0177706 | A1* | 7/2013 | Baluja | C23C 16/4405 |
| | | | | 427/226 |
| 2014/0083450 | A1 | 3/2014 | Ye | |
| 2016/0020071 | A1* | 1/2016 | Khaja | H01J 37/32357 |
| | | | | 427/569 |
| 2017/0069463 | A1* | 3/2017 | Kang | H01J 37/32449 |
| 2017/0213709 | A1* | 7/2017 | Wu | C23F 4/00 |
| 2017/0323768 | A1* | 11/2017 | Zhang | H01J 37/32082 |

FOREIGN PATENT DOCUMENTS

| | | | | |
|---|---|---|---|---|
| EP | 1154038 | A1 | 11/2001 | |
| EP | 3026691 | B1 * | 5/2020 | ............ H01J 27/32 |
| JP | 11-16845 | * | 1/1999 | ........... H01L 21/205 |
| JP | 2001096244 | A | 4/2001 | |
| JP | 2004-68145 | * | 3/2004 | ............ C25D 11/04 |
| JP | 2005-109041 | A * | 4/2005 | ......... H01L 21/3065 |
| JP | 2007507887 | A | 3/2007 | |
| KR | 10-2009-0025053 | * | 3/2009 | ........... H01L 21/205 |
| KR | 101232904 | B1 | 2/2013 | |
| KR | 101637099 | B1 | 7/2016 | |
| KR | 20160137129 | A | 11/2016 | |
| KR | 20180066504 | A | 6/2018 | |
| KR | 20180123992 | A | 11/2018 | |
| KR | 20190057252 | A | 5/2019 | |
| TW | I377267 | B | 11/2012 | |
| TW | 201410914 | A | 3/2014 | |
| TW | 201840892 | A | 11/2018 | |
| WO | WO 2011/084381 | A2 * | 7/2011 | ........... H01L 31/042 |

OTHER PUBLICATIONS

Saurabh, J., et al., "Maintaining reproducible plasma reactor wall conditions: plasma cleaning of films deposited on chamber walls during Cl2/O2 plasma etching of Si". J. Vac. Sci. Technol. A 20 (4), Jul.-Aug. 2002, pp. 1195-1201.*

Popescu, M N, et al., "Precursor films in wetting phenomena". J. Phys.: Condens. Matter 24 (2012) 243102, pp. 1-30.*

International Search Report for PCT/KR2020/008856 mailed Oct. 13, 2020.

Written Opinion for PCT/KR2020/008856 mailed Oct. 13, 2020.

* cited by examiner

METHOD FOR CLEANING CHAMBER OF SUBSTRATE PROCESSING APPARATUS

TECHNICAL FIELD

The present disclosure relates to a chamber cleaning method for a substrate processing apparatus, and more particularly, to a chamber cleaning method including a stabilizing process for preventing damage to the inside of the chamber.

BACKGROUND ART

In general, a semiconductor element is manufactured by depositing various materials in thin film shapes on a substrate and patterning the resultant. To this end, several stages of mutually different processes, such as a deposition process, an etching process, a cleaning process, and a drying process, are performed. Here, the deposition process is performed to form, on a substrate, a thin film having a property required as a semiconductor element. However, during a deposition process for forming a thin film, byproducts including deposits are deposited not only in a desired region on a substrate, but also inside a chamber, in which the deposition process is performed.

In addition, the byproducts deposited inside the chamber are peeled off when the thickness thereof increases, and hence cause generation of particles. In addition, particles enter into a thin film formed on the substrate or act as a cause for defect and thus increase the defect rate of a product. Thus, it is necessary to remove these byproducts deposited inside the chamber before the byproducts are peeled off.

In a cleaning process for removing byproducts deposited inside the chamber, chlorine (Cl) gas and hydrogen (H) gas are used. That is, hydrogen chloride (HCl) gas, generated by a reaction between the chlorine (Cl) gas and the hydrogen (H) gas, etches the byproducts deposited inside the chamber, and thus, the byproducts are removed.

Meanwhile, the inside of the chamber may have partially different temperatures, and in a portion having, for example, a low temperature no higher than approximately 150° C., products generated by an etching reaction between hydrogen chloride (HCl) and byproducts and including chlorine (Cl) may be deposited and remained.

In addition, an event may occur in which the chamber should be open according to the state of the deposition device, a process condition, and an external environment. When the chamber is open, the inside of the chamber is exposed to the air, and at this point, the deposits including chlorine (Cl) deposited inside the chamber during cleaning or after cleaning react with moisture in the air, and thus, hydrogen chloride (HCl) is generated. This hydrogen chloride (HCl) may corrode the inside of the chamber, such as the inner walls of the chamber, a susceptor, and a gas injection part, and thus may damage the chamber.

PRIOR ART DOCUMENT

Patent Document (Patent Document 1) Korean Patent Publication No. 10-1232904

DISCLOSURE

Technical Problem

The present disclosure provides a chamber cleaning method capable of preventing damage inside a chamber.

The present disclosure also provides a chamber cleaning method capable of improving the characteristics of a thin film.

Technical Solution

In accordance with an exemplary embodiment, a chamber cleaning method includes a chamber stabilizing process for transporting a substrate, on which a thin film deposition process has been completed, out of a chamber and processing an inside of the chamber, wherein the chamber stabilizing process includes: a cleaning process for injecting a cleaning gas into the chamber and etching and cleaning byproducts generated by the thin film deposition; and a coating process for injecting a gas including at least one among aluminum (Al), zirconium (Zr) or hafnium (Hf) into the chamber as a coating gas, and generating a protective film on at least one surface of an inner wall of the chamber and components installed inside the chamber.

The cleaning gas may include at least one among chlorine (Cl) or hydrogen (H).

The cleaning process may include a process for generating plasma inside the chamber.

The protective film formed by the coating process may include a metal oxide film.

The protective film may include at least one among an aluminum oxide, a zirconium oxide, or a hafnium oxide.

The protective film may favorably be formed in a thickness of no less than approximately 100 Å.

The chamber stabilizing process may include a seasoning process performed after the coating process, and the seasoning process may include a process for injecting a deposition gas used in the deposition process.

The thickness of a seasoning thin film deposited inside the chamber by the seasoning process may be no less than approximately 100 Å. The thin film deposited on the substrate by the deposition process may be a metal oxide film.

The metal thin film deposited on the substrate by the deposition process may be an active layer of a thin film transistor.

Upon forming the active layer in the deposition process, the active layer may be formed by doping at least one among indium (In) or gallium (Ga) into zinc oxide (ZnO).

Advantageous Effects

In a chamber stabilizing process in accordance with exemplary embodiments, a protective film coating process is performed in situ after completing a cleaning process inside a chamber.

In the protective film coating process, an internal part inside the chamber and a chamber inside wall surface may be damaged during the chamber cleaning process using a corrosive gas or after the cleaning process.

Thus, reaction after the cleaning process between the parts exposed to corrosion and moisture may be suppressed by performing the protective film coating process. Accordingly, the generation of a corrosive matter, for example, hydrogen chloride (HCl), may be prevented or suppressed, so that the inside of the chamber may be prevented from being corroded, that is, damaged.

In addition, a seasoning process may further be performed in situ inside the chamber after the protective layer coating process. When performing the seasoning process, an atmosphere similar to that during the next deposition process is built inside the chamber 100, so that factors acting as impurities during the deposition process may be reduced and there is an effect of improving characteristics of the thin film generated after completing the protective film coating process and the seasoning process.

In addition, there are effects of improving the performance of an element, for example, a thin film transistor is improved, and reducing deviation in performance In addition, in an exemplary embodiment, the deposition process and the chamber stabilizing process are performed in situ, so that infiltration of impurities into the chamber may be effectively blocked, and thus, corrosion inside the chamber may be more effectively prevented or suppressed.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
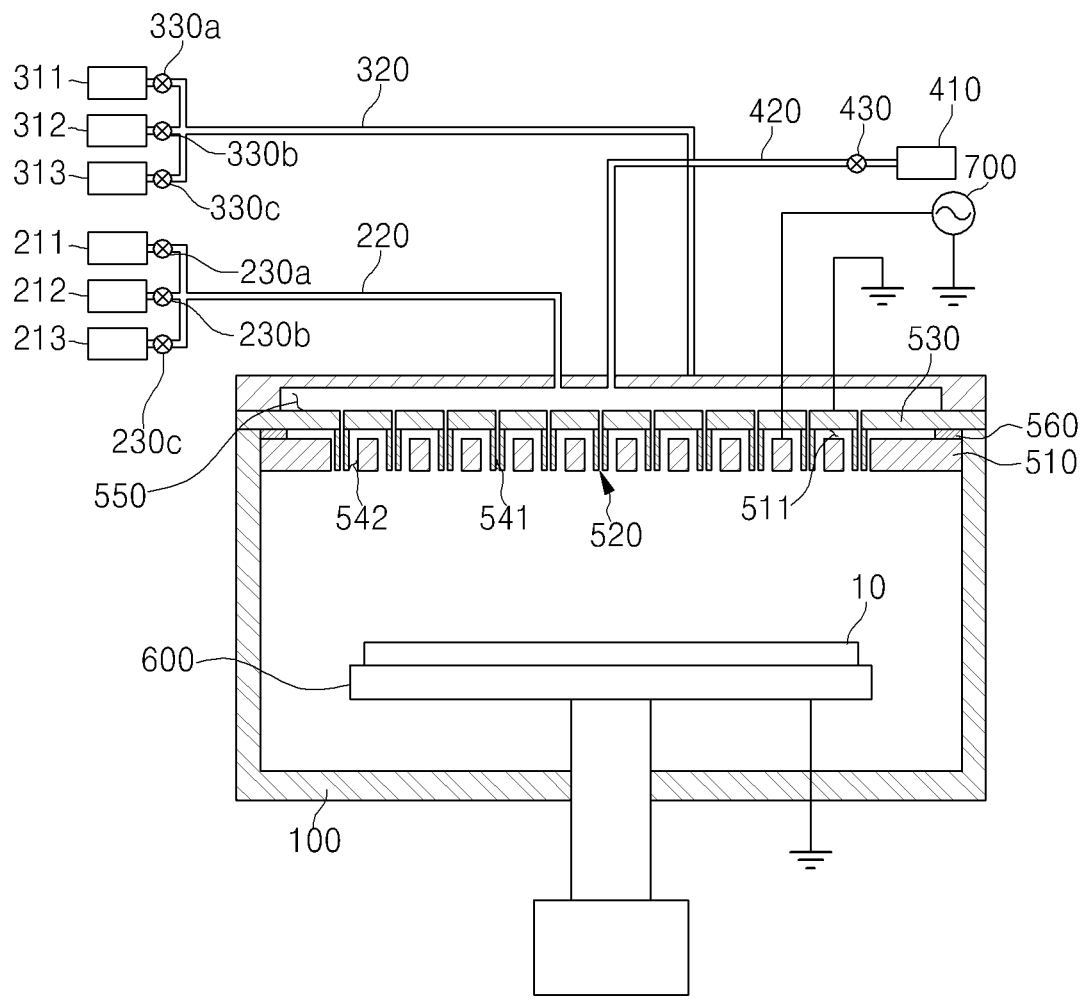
FIG. 1 is a view illustrating a substrate processing apparatus that performs a chamber cleaning method in accordance with an exemplary embodiment.

Hereinafter exemplary embodiments will be described in detail with reference to the accompanying drawings. However, the present invention will, however, be embodied in various forms and should not be construed as limited to the embodiments set forth herein. Rather, these embodiments are provided so that this disclosure will be thorough and complete, and will fully convey the scope of the present invention to those skilled in the art. To describe exemplary embodiments, drawings may be exaggerated and like reference numerals denote like elements in the drawings.

Figure 2:
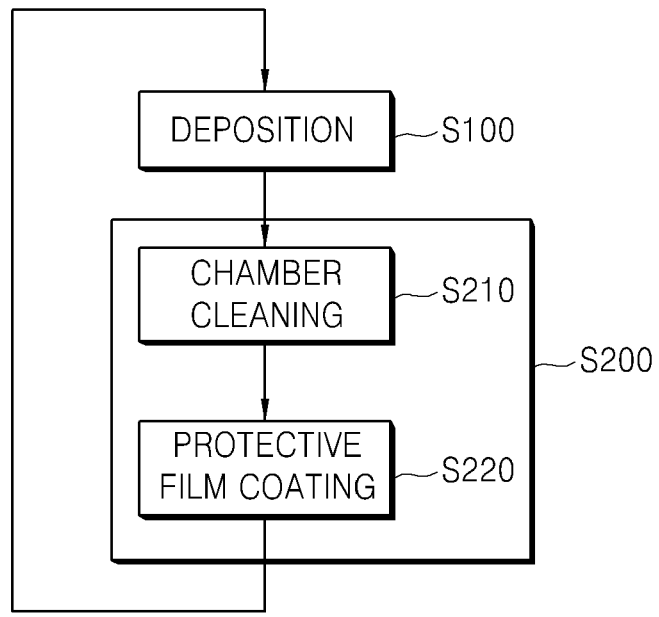
FIG. 2 is a flow chart illustrating a chamber cleaning method in accordance with a first exemplary embodiment.
Figure 3:
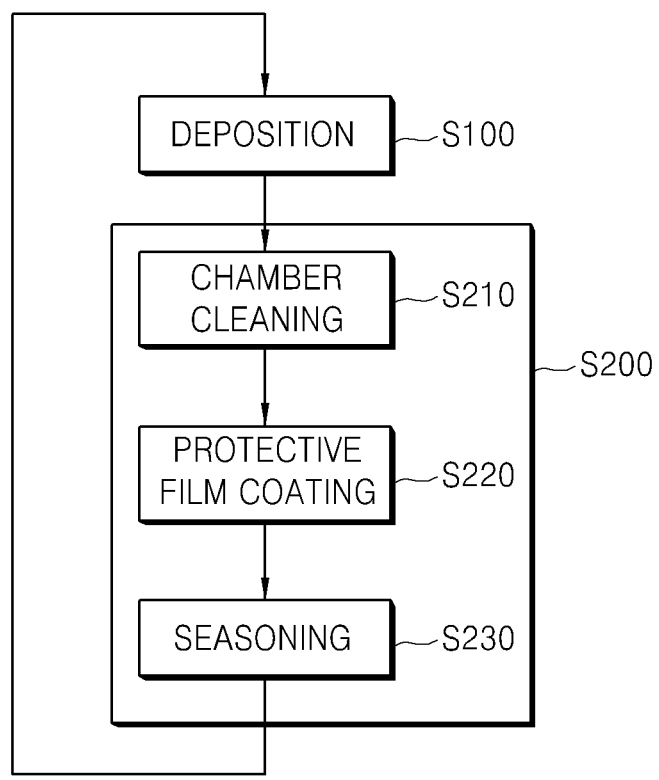
FIG. 3 is a flow chart illustrating a chamber cleaning method in accordance with a second exemplary embodiment.
Figure 4:
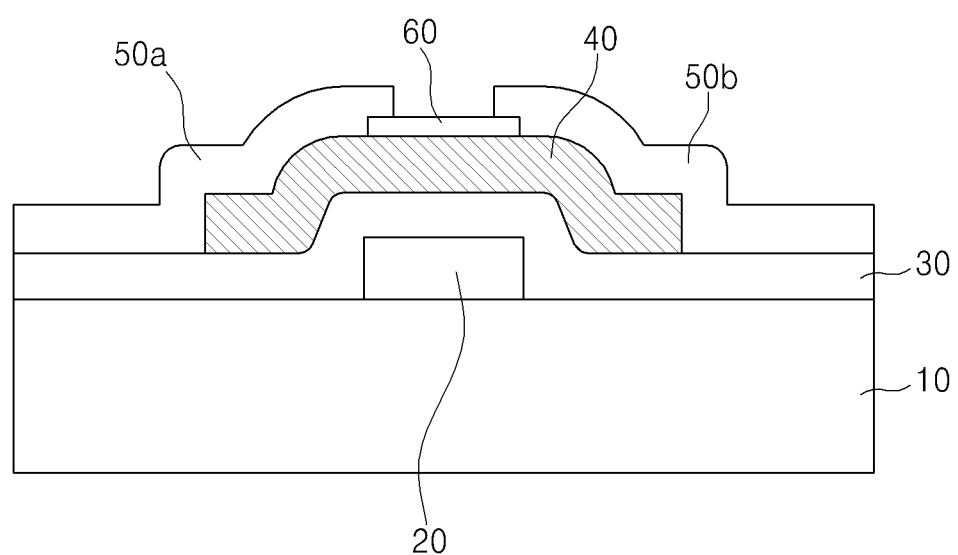
FIG. 4 is a view illustrating a thin film transistor.

FIG. 1 is a view illustrating a substrate processing apparatus that performs a chamber cleaning method in accordance with an exemplary embodiment. FIG. 2 is a flow chart illustrating a chamber cleaning method in accordance with a first exemplary embodiment. FIG. 3 is a flow chart illustrating a chamber cleaning method in accordance with a second exemplary embodiment. FIG. 4 is a view illustrating a thin film transistor, and is a view for describing a chamber cleaning method in accordance with an exemplary embodiment.

First, referring to FIGS. 2 and 3, a chamber cleaning method in accordance with exemplary embodiments will be simply described.

A chamber cleaning method in accordance with an exemplary embodiment includes: a process (hereinafter, thin film deposition process S100) for depositing a thin film on a substrate; and a process (hereinafter, chamber stabilizing process S200) for removing inside byproducts after completing the deposition and performing cleaning and coating (hereinafter, chamber stabilizing process S200) on the chamber inside to prevent damage. At this point, in the chamber stabilizing process method in accordance with an exemplary embodiment, a thin film deposition process S100 and a chamber stabilizing process S200 are performed in situ.

Here, the chamber stabilizing process S200 includes: a chamber cleaning process S210 for removing byproducts inside the chamber after completing the thin film deposition process S100 as in the first embodiment; and a protective film coating process S220 for coating a protective film on the inside of the chamber after completing cleaning.

In addition, the chamber stabilizing process S200 may further include a seasoning process S230 in which the chamber inside is adjusted so as to be similar to the atmosphere of a deposition process performed after completing the protective film coating process S220 as in the second exemplary embodiment illustrated in FIG. 3.

Here, the thin film deposition may be named as a thin film deposition process S100. In addition, the chamber cleaning may be named as a chamber cleaning process S210, the protective film coating may be names as a protective film coating process S220, and the seasoning may be named as a seasoning process S230.

Hereinafter, referring to FIG. 1, a substrate processing apparatus will be described that performs a cleaning method in accordance with exemplary embodiments.

As described above, in the substrate processing apparatus, the deposition process S100 for depositing a thin film on the substrate 10 and a chamber stabilizing process S200 are performed in situ, and the deposition process S100 may be a process for depositing a metal oxide film.

In a more specific example, the deposition process S100 using the substrate processing apparatus may be a process for forming a metal oxide thin film for forming the active layer of a thin film transistor. In addition, a metal oxide film formed in the deposition process S100, that is, the active layer may be a thin film in which at least one among indium (In) and gallium (Ga) is doped into, for example, zinc oxide (ZnO). That is, the active layer may be any one among an IZO thin film in which indium (In) is doped into zinc oxide (ZnO), a GZO thin film in which gallium (Ga) is doped into zinc oxide (ZnO), and an IGZO thin film in which indium (In) and gallium (Ga) are doped into zinc oxide (ZnO).

Referring to FIG. 1, a substrate processing apparatus in accordance with an exemplary embodiment includes a chamber 100, first to third gas supply parts 200, 300, and 400 that provide mutually different gases; an injection part 500 that is provided with first passage 541 in which gas provided from the first and third gas supply parts 200 and 400 moves; second passage 542 in which gas provided from the second gas supply part 300 moves and that is installed inside the chamber 100 and injects a gas; and a susceptor 600 which is installed inside the chamber 100, is positioned facing the injection part 500, and has an one surface which faces the injection part 500 and on which the substrate 10 is mounted.

In addition, the substrate processing apparatus may include an RF power supply part 700 that applies power for generating plasma inside a chamber 100.

The chamber 100 may include a process space in which a thin film may be formed on a substrate newly transported into the chamber. For example, the cross-sectional shape of the chamber inside may be a shape of a rectangle, a pentagon, a hexagon, or the like. Of course, the shape of the chamber 100 inside may variously be changed and it is desirable to provide the shape so as to correspond to the shape of the substrate 10.

The injection part 500 is disposed facing the susceptor 600 inside the chamber 100, and includes a first plate 510 that is aligned in the extension direction of the susceptor 600 and is provided with holes (hereinafter injection holes 511) disposed to be spaced apart from each other; and a plurality of nozzles 520 that are provided so as to be inserted into a plurality of injection holes 511.

In addition, the injection part 500 includes: a second plate 530 installed so as to be positioned between an upper wall inside the chamber 100 and the first plate 510 inside the chamber 100; and an insulating part 560 positioned between the first plate 510 and the second plate 530.

Here, the first plate 510 may be connected to an RF power supply part 700 and the second plate may be grounded. In addition, the insulating part 560 functions to prevent electrical connection between the first plate 510 and the second plate 530.

The first plate 510 may have a plate shape that extends and is formed in the extension direction of the susceptor 600. In addition, the first plate 510 is provided with the plurality of injection holes 511 and each of the plurality of injection holes 511 may be provided to pass through the first plate 510 in the vertical direction. In addition, the plurality of injection holes 511 are aligned and disposed in the extension direction of the first plate 510 or the susceptor 600.

Each of the plurality of nozzles 520 may have a shape extending in the vertical direction, and a passage through which a gas may pass is provided inside the nozzles, and the upper ends and the lower ends the nozzles are opened. In addition, the plurality of nozzles 520 are installed so that at least lower portions thereof are inserted into the injection holes 511 provided in the first plate 510, and the upper portions thereof are installed so as to be connected to the second plate 530. Accordingly, the nozzles 520 may be described to have shapes protruding downward from the second plate 530.

The outer diameters of the nozzles 520 are provided to be small compared to the inner diameters of the injection holes 511, and in inserting and installing the nozzles 520 into injection holes 511, the nozzles are installed so that the outer peripheral surfaces of the nozzles 520 are spaced apart from the peripheral wall (that is, the inner wall of the first plate 510) of the injection holes 511. Accordingly, the insides of the injection holes 511 are separated into outer spaces of the nozzles 520 and inner spaces of the nozzles 520.

The passages inside the nozzles 520 in the injection holes 511 are passages through which gases supplied from the first and third gas supply parts 200 and 400 are moved and injected. In addition, the outer spaces of the nozzles 520 inside the injection holes 511 is the passages through which a gas supplied from the second gas supply part 300 is moved and injected.

Thus, hereinafter, the nozzle-inside passages are named as first passages 541 and the inner spaces of the nozzles 520 inside the injection holes 511 are referred to as first passages 541 and the outer space of the nozzles 520 are referred to as second passages 542.

The second plate 530 is installed so that an upper surface thereof is spaced apart from an upper wall inside the chamber 100 and a lower surface thereof is spaced apart from the first plate 510. Accordingly, vacant spaces are provided between the second plate 530 and the first plate 510 and between the second plate 530 and the upper wall of the chamber 100.

Here, the upper space of the second plate 530 is a space (hereinafter, gas diffusion space 550) in which the gas supplied from the first and third gas supply parts 200 and 400 that are described later, and communicates with the upper openings of the plurality of nozzles 520. In other words, the gas diffusion space 550 is a space communicating with the plurality of first passages 541. Accordingly, the gas provided from the first and third gas supply parts 200 and 400 and supplied to the gas diffusion space 550 is supplied and injected to the plurality of first passages 541.

In addition, a gun drill (not shown) that is a passage through which gas moves is provided inside the second plate 530, and the gun drill is connected to a second feed pipe 320 of a second gas supply part 300 and is provided so as to communicate with the second passage 542. Thus, the gas supplied from the second gas supply part 300 may be injected to the substrate 10 via the gun drill of the second plate 530 and the second passage 542.

In the first to third gas supply parts 200, 300 and 400, mutually different types of gases may be supplied to a process space of the chamber. Hereinafter, for convenience of description, the gas supplied from the first gas supply part 200 is referred to as a first gas, the gas supplied from the second gas supply part 300 is referred to as a second gas, and the gas supplied from the third gas supply part 400 is referred to as a third gas.

In addition, a chamber cleaning method using a substrate processing apparatus in accordance with an exemplary embodiment may be performed, a deposition process and a chamber stabilizing process are performed, and the deposition process and the chamber stabilizing process may each be performed via reaction products between the first gas and the second gas.

Accordingly, the first and second gas supply parts 200 and 300 are provided so as to supply gases respectively for the deposition process and the stabilizing process that process the chamber inside. At this point, the second gas provided from the second gas supply part 300 is the gas reacting with the first gas supplied from the first gas supply part 200. In addition, the third gas supply part 400 provides a gas for purge during the chamber processing process.

In other words, the first gas supplied from the first gas supply part 200 and the second gas supplied from the second gas supply part 300 respectively include a gas for deposition and a cleaning gas for chamber treatment. That is, the first and second gases may respectively include gases for deposition and cleaning and protective film coating. In addition, the third gas supplied from the third gas supply part 400 includes a purge gas for purging when coating a protective film during the chamber treatment process.

Hereinafter, the first to third gas supply parts 200, 300 and 400 will be described.

The first gas supply part 200 includes: a first storage part 210 that stores the first gas; and a first feed pipe 220 that has one end connected to the first storage part 210, the other end connected to a gas diffusion space 550, and a passage in which the first gas is moved. Accordingly, the first gas supplied from the first storage part 210 may be moved and injected so as to pass through the gas diffusion space 550 and the plurality of nozzles 520, that is, the plurality of first passages 541.

The first storage part 210 may include: a first deposition gas storing part 211 that stores a gas (first deposition gas) for deposition; a first cleaning gas storing part 212 that stores a gas (first cleaning gas) for cleaning; and a first coating gas storing part 213 that stores a gas (first coating gas) for protective film coating.

The first deposition gas stored in the first deposition gas storing part 211 is a source material gas for thin film deposition, and the first deposition gas storing part 211 may store a raw material gas including zinc (Zn), a raw material gas including indium (In), and a raw material gas including gallium (Ga) in respective canisters (not shown) of the source gases, and the source material gases may be supplied to the chamber 100. That is, the first deposition gas supplied to the chamber through the first feed pipe 220 may include the raw material gas including zinc (Zn), the raw material gas including indium (In), and the raw material gas including gallium (Ga).

At this point, the raw material gas including zinc (Zn), the raw material gas including indium (In), and the raw material gas including gallium (Ga) may be stored in a single first deposition gas storing part 211, or the first deposition gas storing part 211 is divided into three storing parts and may respectively stores the raw material gas including zinc (Zn), the raw material gas including indium (In), and the raw material gas including gallium (Ga).

Here, at least one among diethyl zinc ($Zn(C_2H_5)_2$; DEZ) or dimethyl zinc ($Zn(CH_3)_2$; DMZ) may be used as the raw material gas including zinc (Zn), at least one among trimethyl Indium ($In(CH_3)_3$; TMIn) or diethylamino propyl dimethyl indium (DADI) may be used as the raw material gas including indium (In), and trimethyl gallium ($Ga(CH_3)_3$; TMGa) or the like may be used as the raw material gas including gallium (Ga).

The first cleaning gas stored in the first cleaning gas storing part 212 is a source material gas for removing byproducts inside the chamber 100, and the first cleaning gas storing part 212 may store a raw material gas including, for example, chlorine (Cl) gas. That is, the first cleaning gas may include a raw material gas including chlorine (Cl). Here, at least one among $Cl_2$, $BCl_3$ or $ClF_3$ may be used as the raw material gas including chlorine (Cl).

The first coating gas stored in the first coating gas storing part 213 is a source material gas for coating a protective film inside the chamber 100 in which the cleaning process has been completed.

In the exemplary embodiment, a protective film is coated inside the chamber 100 in which the cleaning process has been completed, and the protective film may be formed in a metal oxide film. More specifically, the protective film may be formed of any one among an aluminum oxide such as $Al_2O_3$, a zirconium oxide such as $ZrO_2$, or a hafnium oxide such as $HFO_2$.

Accordingly, the first coating gas storing part 213 may store a source material gas for forming any one among aluminum oxide, zirconium oxide, and hafnium oxide, for example, at least any one among a raw material gas including aluminum (Al), a material gas including zirconium (Zr), or a raw material gas including hafnium (Hf). That is, the first coating gas may include at least any one among a raw material gas including aluminum (Al), a material gas including zirconium (Zr), or a raw material gas including hafnium (Hf).

Here, trimethylaluminum ($A(CH_3)_3$; TMA) may be used as the raw material gas including aluminum (Al), tetrakis (ethylmethylamino)Zr (TEMAZr) may be used as the raw material gas including zirconium (Zr), and tetrakis-ethyl methyl amino hafnium ($Hf[NC_2H_5CH_3]_4$; TEMAH), tetrakis-diethyl amino hafnium ($Hf[N(C_2H_5)_2]_4$; TDEAH), tetrakis-dimethyl amino hafnium ($Hf[(CH_3)_2]_4$); TDMAH), $Hf[N(C_3H_7)_2]_4$ or $Hf[N(C_4H_9)_2]_4$ may be used as the raw material gas including hafnium (Hf).

The first feed pipe 220 is a means for moving the first gas supplied from the first storage part 210 to the first passages 541. That is, during the deposition process, the first deposition gas supplied from the first deposition gas storing part 211 moves to the plurality of nozzles 520 via the first feed pipe 220 and the gas diffusion space 550. In addition, during the cleaning process, the first cleaning gas supplied from the first cleaning gas storing part 212 moves to the plurality of nozzles 520 via the first feed pipe 220 and the gas diffusion space 550. In addition, during the coating process, the first coating gas supplied from the first coating gas storing part 213 moves to the plurality of nozzles 520 via the first feed pipe 220 and the gas diffusion space 550.

The first feed pipe 220 may have a pipe shape provided therein with a passage through which a gas may move. In addition, valves 230a, 230b, and 230c may be installed which controls the communication between each of the first deposition gas storing part 211, the first cleaning gas storing part 212, and the first coating gas storing part 213 adjusts and the first feed pipe, and adjusts the gas feed amount.

The second gas supply part 300 includes: a second storage part 310 that stores the second gas; and a second feed pipe 320 that has one end connected to the second storage part 310 and the other end connected to a gun drill provided inside a second plate 530, and that includes a passage in which the second gas is moved. Accordingly, the second gas supplied from the second storage part 310 may pass through the gun drill of the second plate 530 and may be injected through second passages 542 provided inside a first plate 510.

The second storage part 310 includes: a second deposition gas storing part 311 that stores a gas (second deposition gas) for deposition; a second cleaning gas storing part 312 that stores a gas (second cleaning gas) for cleaning; and a second coating gas storing part 313 that stores a gas (second coating gas) for protective film coating.

The second deposition gas stored in the second deposition gas storing part 311 may be a reaction raw material gas that reacts with the first deposition gas and generates a reaction product for thin film deposition. That is, the second deposition gas may be a gas different from the first deposition gas and be a reaction raw material gas reactable with the first deposition gas, for example, a raw material gas including oxygen (O). Here, at least one among pure oxygen ($O_2$), nitrous oxide ($N_2O$) or ozone ($O_3$) may be used as the raw material gas including oxygen (O), that is, as a second deposition gas.

The second cleaning gas stored in the second cleaning gas storing part 312 may be a reaction raw material gas that reacts with the first cleaning gas and generates a reaction product for removing byproducts. That is, the second cleaning gas may be a gas different from the first cleaning gas and be a reaction raw material gas reactable with the first cleaning gas, for example, may be a raw material gas including hydrogen (H). Here, at least one among $H_2$, $CH_4$, or $H_2O$ may be used as the raw material gas including hydrogen (H).

The second coating gas stored in the second coating gas storing part 313 may be a reaction raw material gas that reacts with the first coating gas and generates a reaction product for protective film coating. That is, the second coating gas may be a gas different from the first coating gas, and be a raw material gas reactable with the first coating gas. As described above, a protective film is formed by using any one among aluminum oxide, zirconium oxide, or hafnium oxide, and when the first coating gas is a raw material gas including any one among aluminum (Al), zirconium (Zr), and hafnium (Hf), the second coating gas may be a gas including oxygen (O). Here, at least one among pure oxygen ($O_2$), nitrous oxide ($N_2O$) or ozone ($O_3$) may be used as the raw material gas including oxygen (O), that is, as a second coating gas.

The second feed pipe 320 may be a means for moving the second gas supplied from the second storage part 310 to the second passages 542. That is, the second deposition gas supplied from the second deposition gas storing part 311 during the deposition process passes through the second feed pipe 320 and the gun drill provided to the second plate 530 and moves to the second passages 542, the second cleaning gas supplied from the second cleaning gas storing part 312 during the cleaning process passes through the second feed pipe 320 and the gun drill provided to the second plate 530 and moves to the second passages 542, and the second coating gas supplied from the second coating gas storing part 313 during the coating process passes through the second feed pipe 320 and the gun drill provided to the second plate 530 and moves to the second passages 542. In addition, the second deposition gas, the second cleaning gas, and the second coating gas may each be injected through the second passages 542.

The second feed pipe 320 may have a pipe shape provided with a passage in which a gas may move, and have a gun drill (not shown) shape in which a straight-line long hole is formed in the second plate 530 of the chamber 100 to cause a gas to flow.

In addition, valves 330a, 330b, and 330c may be installed which controls the communication between each of the second deposition gas storing part 311, the second cleaning gas storing part 312, and the second coating gas storing part 313 adjusts and the second feed pipe, and adjusts the gas feed amount.

As described above, the second deposition gas and the second coating gas may both be gases including oxygen (O) and the same gas may be used. As such, when the same gas is used as the second deposition gas for thin film deposition and the second coating gas for protective film coating, the second storage part 310 may be provided so as to have any one among the second deposition gas storing part 311 or the second coating gas storing part 313.

Of course, mutually different gases may be used as the second deposition gas and the second coating gas. In this case, the second storage part 310 in the second storage part 310, the second deposition gas storing part 311 and the second coating gas storing part 313 which store mutually different gases may be separately provided.

The third gas supply part 400 includes: a third storage part 410 that stores a third gas; and a third feed pipe 420 that has one end connected to the third storage part 410, the other end connected to the gas diffusing space 550, and that includes a passage in which the third gas is moved. Accordingly, the third gas supplied from the third storage part 410 may be moved and injected so as to pass through the gas diffusion space 550 and the plurality of nozzles 520, that is, the plurality of first passages 541.

The third storage part 410 stores a gas (hereinafter, purge gas) for purging when forming a protective film. The purge gas stored in the third storage part 410 may be an inert gas, such as nitrogen gas.

The third feed pipe 420 is a means for moving the third gas supplied from the third storage part 410, that is, the purge gas, to the injection part 500. That is, during the protective film coating process, the third deposition gas supplied from the third storing part 410 passes through the third feed pipe 420 and the gas diffusion space 550 and then moves to the plurality of nozzles 520.

The third feed pipe 420 may have a pipe shape provided therein with a passage through which a gas may move. In addition, a valve 430 may be installed which controls the communication between the third storage part 410 and the third feed pipe 420 and adjusts the gas feed amount.

The susceptor 600 is disposed inside the chamber 100 facing the injection part 500 or so that the susceptor and the injection part face each other. At this point, the susceptor 600 may be positioned inside the chamber, for example, below the injection part 500. The susceptor 600 may be provided in a shape corresponding to the shape of the substrate 10, for example, in a rectangular or a circular shape. In addition, the area of the susceptor 600 may favorably be greater than that of the substrate 10. In addition, the susceptor 600 may be configured to embed a heater (not shown) and a cooling means (not shown), and the susceptor 600 and the substrate 10 may be adjusted to a target temperature by operating at least one among the heater or the cooling means.

The above-mentioned chamber 100, the injection part 500, and the susceptor 600 may be provided by using a material including a metal, such as, aluminum (Al).

The RF power supply part 700 is a means for applying a power that generates plasma inside the chamber 100. More specifically, the RF power supply part 700 is a means for applying RF power for generating plasma, and may be connected to the first plate of the injection part 500. In addition, the RF power supply part 700 may also include an impedance matching circuit for matching the load impedance of the power supply for generating plasma and the source impedance. The impedance matching circuit may be configured to include two impedance elements composed of at least one among a variable capacitor or a variable inductor.

In addition, the injection part 500 and the susceptor 600 disposed facing the same, and the second plate 530 may each be configured to be grounded.

Accordingly, in the RF power supply part 700, when the RF power supply is applied to the first plate 510 and the susceptor 600 and the second plate 530 are grounded, plasma may be generated inside the second passages 542 in the injection part 500 and in a space between the first plate 510 and the susceptor 600.

Here, when the plasma is generated in the space between the first plate 510 and the susceptor 600, the plasma is generated closer to the injection part than to the susceptor 600. More specifically, the plasma may be generated directly below the injection part 500.

Hereinafter, referring to FIGS. 1, 2 and 4, a chamber cleaning method in accordance with a first exemplary embodiment will be described.

Referring to FIG. 2, a chamber cleaning method includes: a thin film deposition process S100 for depositing a thin film on a substrate 10; and a chamber stabilizing process S200 for removing particles due to byproducts generated during deposition process after completing thin film deposition, and processing the chamber inside to prevent damage to the chamber inside. Here, the thin film deposition process S100 and the chamber stabilizing process S200 are performed in situ.

First, for the thin film deposition process, the substrate 10 is transported into the chamber 100 and mounted on the susceptor 600.

Here, the thin film to be deposited in the thin film deposition process S100 is an active layer 40 of a thin film transistor, and an example will be described I which the active layer 40 is an IGZO film in which indium (In) and gallium (Ga) are doped into zinc oxide (ZnO). Accordingly, as illustrated in FIG. 4, the substrate 10 mounted on the susceptor 600 may be a substrate on which a gate electrode 20 and a gate insulating film 30 are laminated.

For thin film deposition on the active layer 40, a first deposition gas, which is a source raw material gas for active layer deposition, is injected to first passages 541 and a second deposition gas, which is a reaction raw material gas for active layer deposition, is injected to second passages 542.

To this end, a first gas supply part 200 supplies to the first passages 541, and a second gas supply part 300 supplies to the second passages 542, the first and second gases respectively for active layer deposition. That is, the first deposition gas including a raw material gas including zinc (Zn), a raw material gas including indium (In), and a raw material gas including gallium (Ga) is supplied from the first deposition gas storing part 211 to a first feed pipe 220. Accordingly, the first deposition gas moves to a gas diffusion space 550 through the first feed pipe and is then supplied to and injected through a plurality of nozzles, that is, a plurality of first passages 541. In addition, a second deposition gas including oxygen is supplied from a second deposition gas storing part 311 to a second feed pipe. Accordingly, the second deposition gas may move through the second feed pipe 320 and be supplied to the second passages 542 inside a first plate 510 through a flow passage (not shown) inside a second plate 530, and then injected from the second passages 542 to a process space.

When the first and second deposition gases are injected, an RF power supply part 700 may apply RF power supply to the first plate 510. When RF power is applied to the first plate 510, plasma may be generated in the second passages 542 inside the injection part 500 and a space between the first plate 510 and the susceptor 600. At this point, a reaction occurs between the first deposition gas that passes through or is injected through the first passages 541 and the second passages 542, and an IGZO film, that is, an active layer 40, may be formed on the gate insulating film 30.

In the above-mentioned embodiment, it has been described that plasma is formed by operating the RF power supply part 700 in the deposition process for forming the active layer 40. However, the exemplary embodiments are not limited thereto, and a thin film, that is, the active layer 40, the gate insulating film 30, and the like may be formed by not forming plasma but injecting the first deposition gas and the second deposition gas and raising the temperature of the chamber 100 to a high temperature to react the gases. When the active layer 40 deposition process is completed, the substrate 10 may be transported out of the chamber 100.

Subsequently, the chamber stabilizing process S200 for processing the chamber 100 may be performed.

Meanwhile, byproducts may be deposited inside the chamber 100 during the deposition process. More specifically, byproducts may be deposited on the inner wall of the chamber 10, a surface of the first plate 510, and on a lower surface of the second plate 530. In addition, since the space between the first plate 510 and the second plate 530 is narrow, and plasma is generated in the space, more byproducts may be deposited on the surface of the first plate 510, the surfaces of the nozzles 520, and the lower surface of the second plate 530 than on the inner wall of the chamber 100.

Upon performing the chamber stabilizing process S200, a chamber cleaning for removing byproducts deposited inside the chamber 100 during the active layer 40 deposition process is first performed (S210).

To this end, gases for chamber cleaning are supplied to the injection part from each of the first and second gas supply parts 200 and 300. That is, a first cleaning gas including chlorine (Cl) is supplied from a first cleaning gas storing part 212 to the first feed pipe 220. Accordingly, the first cleaning gas is supplied to the first passages 541 of the injection part 500 via the first feed pipe 220, and is then injected from the first passages 541. In addition, when a second cleaning gas including hydrogen (H) is supplied from a second cleaning gas storing part 312 to a second feed pipe 320, the second cleaning gas moves through the second feed pipe 320 and is supplied to the second passages 542 of the injection part 500 and is then injected from the second passages 542.

While the first and second cleaning gases are injected through the injection part 500, the RF power supply part 700 may apply RF power to the first plate 510. At this point, plasma may be generated in the second passages 542 inside the injection part 500 and in a space between the first plate 510 and the susceptor 600.

Accordingly, a reaction occurs between the first cleaning gas and the second cleaning gas, and a hydrogen chloride (HCl) gas is generated. The generated hydrogen chloride (HCl) gas is deposited inside the chamber during the thin film deposition process and causes an etching reaction with byproducts including a metal oxide such as zinc oxide (see reaction formula 1). Meanwhile, byproducts are deposited not only on the inner wall of the chamber 100, but also on various components exposed to the inner space of the chamber 100, for example, the susceptor 600, the nozzles 520, the injection part 500, and the like.

Accordingly, the generated hydrogen chloride (HCl) gas reacts with byproducts deposited inside the chamber 100, that is, byproducts deposited on the inner wall of the chamber 100, on the susceptor 600 and the nozzles 520, on the surface of the injection part 500, and the like, and etches and removes the byproducts.

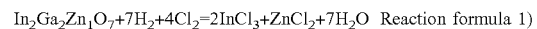

$In_2Ga_2Zn_1O_7+7H_2+4Cl_2=2InCl_3+ZnCl_2+7H_2O$   Reaction formula 1)

Meanwhile, in a portion the temperature of which is low inside the chamber 100, specifically, in a portion of approximately 150° C. or lower, products caused by an etching reaction between the hydrogen chloride (HCl) gas and the byproducts, such as $ZnCl_3$ or $AnCl_2$, may be deposited and remained.

In addition, an event may occur in which the chamber 100 should be open according to changes in the state of the deposition device, a process condition, an external environment and the like after completing the cleaning of the chamber 100. When the chamber 100 is open, the inside of the chamber 100 is exposed to the air, and at this point, residues including chlorine (Cl), that is, $2InCl_3$, $ZnCl_2$, and the like react with moisture in the air, and thus, hydrogen chloride (HCl) gas is generated (see reaction formulae 2 to 4). This hydrogen chloride (HCl) gas may corrode and damage the chamber 100 inside, such as, the inner wall of the chamber 100, the injection part 500, and the susceptor 600.

$InCl_3+H_2O=InOCl+HCl+H_2O$   Reaction formula 2)

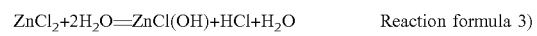

$ZnCl_2+2H_2O=ZnCl(OH)+HCl+H_2O$   Reaction formula 3)

$Al(H_2O)_6Cl_3=Al(OH)_3+3HCl+3H_2O$

Thus, in the exemplary embodiments, in order to prevent or suppress the corrosion of the inside of the chamber 100 due to residues of the chamber cleaning process, a protective film is coated to the inside of the chamber 100 after completing the chamber cleaning (S220). At this point, the chamber cleaning process and a protective film coating process are performed in situ.

Upon coating a protective film to the inside of the chamber 100, the coating may be formed through an atomic layer deposition (ALD) method that is performed by injecting "source gas, purge gas, reaction gas, and purge gas" in this order. In other words, "first gas, purge gas, second gas, and purge gas" are injected in this order, and this injection cycle is repeated to apply a protective film. In addition, the order may be described as "first coating gas, purge gas, second coating gas, and purge gas".

More specifically, first, a first coating gas including at least one raw material gas among aluminum (Al), zirconium (Zr), or hafnium (Hf) from the first coating gas storing part 213 is provided to the first feed pipe 220. Accordingly, the first coating gas is supplied to the first passages 541 of the injection part 500 via the first feed pipe 220, and is then injected to a process space inside the chamber 100.

Next, a third gas is purged. That is, when the third gas, which is the purge raw material such as nitrogen gas, is provided from the third storage part 410 to the first feed pipe 220, the purge gas is supplied to the first passages 541 via the first feed pipe 220, and is then injected and purged.

Subsequently, a second coating gas that reacts with the first coating gas is supplied to the injection part 500. That is, when a second coating gas including oxygen (O) is supplied from a second coating gas storing part 313 to a second feed pipe 320, the second coating gas moves through the second feed pipe 320 to a gun drill passage (not shown) of the second plate 530, is then supplied to the second passages 542, and is then injected to a process space inside the chamber 100.

When the second coating gas including oxygen (O) is injected, the second coating gas and the first coating gas react, and thus, at least one reaction product among aluminum oxide, zirconium oxide, or hafnium oxide is generated. In addition, a film of a reaction product, that is, at least one among aluminum oxide, zirconium oxide, or hafnium oxide, is deposited or coated to the inside of the chamber 100, such as, the inner wall of the chamber 100 and the surfaces of the susceptor 600 and the injection part 500. In addition, in the injection part 500, the film may be deposited on the outer peripheral surfaces of the nozzles 520, the second passage 542 defining inner surfaces of the first plate 510, the outer surface of the first plate 510, and the lower surface of the second plate 530. As such, the coated film due to the reaction of the first coating gas and the second coating gas is the protective film.

Next, when a purge gas is injected through a third gas supply part 400, the reaction byproducts between the first coating gas and the second coating gas may be purged.

In the above, it has been described that the protective film is formed through an atomic layer deposition (ALD) method that is performed in the cycle of "source gas, purge gas, reaction gas, and purge gas".

However, embodiments are not limited thereto, and the protective film may be formed through a method in which plasma is generated by sequentially injecting a source gas, a purge gas, and a reaction gas and then operating the RF power supply part 700.

In other words, the protective film may be formed by sequentially injecting a first coating gas, a purge gas as a third gas, and a second coating gas, and then operating the RF power supply part 700.

The protective film may be formed through still another method, in which a source gas and a purge gas are sequentially injected, a reaction gas is started to be injected before completing the injection of the purge gas, and operating the RF power supply part 700 after completing the injection of the reaction gas.

In other words, the protective layer may be formed through a method in which the first gas and a purge gas as the third gas are sequentially injected, a second coating gas is then started to be injected before completing the injection of the purge gas, and then the RF power supply part 700 is operated after completing the injection of the second coating gas to generated plasma.

Residues including the remaining chlorine (Cl) after the chamber cleaning process are coated by the protective film formed thereafter through such the protective film coating process. Thus, even when the chamber 100 inside is exposed to the air by opening the chamber 100 according to a change in the state of the substrate processing apparatus, process conditions, external environments, or the like, the exposure of the residues deposited inside the chamber 100 may be prevented or blocked.

Thus, the reaction between chlorine (Cl) and moisture inside the deposits generated during the cleaning process is prevented. Accordingly, the occurrence of a corrosive gas such as hydrogen chloride (HCl) due to the reaction between chlorine (Cl) and moisture is prevented, and the corrosion of, that is, damage to of the chamber 100 inside may be prevented.

As such, since the protective film prevents the reaction between the deposited film deposited inside the chamber 100 and the moisture during the cleaning process, the protective film may be referred to as a moisture permeation preventing film.

Such the protective film may favorably be formed in a thickness of no less than approximately 100 Å. This is to prevent the exposure of the deposits generated during the cleaning process.

Meanwhile, when the thickness of the protective film is less than approximately 100 Å, the protective film may not partially be coated, or have a smaller thickness. In this case, the deposits generated during the cleaning process and moistures in the air may react when the chamber is open, and therefore a corrosive gas such as hydrogen chloride (HCl) may be generated and the inside of the chamber 100 may be corroded.

Thus, in the exemplary embodiments, the protective film is formed in a thickness of at least approximately 100 Å.

In addition, the upper limit of the thickness of the protective film is not particularly limited, but it may be desirable to set the upper limit to at least approximately 1,000 Å to improve the operation efficiency and productivity of the substrate processing apparatus.

In addition, in the exemplary embodiment, the protective film coating process is performed for no longer than approximately 10 minutes. However, the embodiment is not limited thereto, and as long as the protective film may be formed in a target thickness of no less than approximately 100 Å, the duration is not limited.

When the protective film coating is completed, a substrate 10 which is the next deposition workpiece is loaded into the chamber 100, and the above-mentioned deposition process, for example, an IGZO active layer deposition may be performed.

In the first exemplary embodiment, it has been described that the chamber stabilizing process S200 includes the chamber cleaning process S210 and the protective film coating process S220.

However, embodiments are not limited thereto, and as in the second embodiment illustrated in FIG. 3, the chamber stabilizing process S200 may further include a seasoning process S230 that is performed after the protective film coating process S220.

The seasoning process S230 is a process for processing the inside of the chamber 100 to be similar to the environment during the next deposition process. That is, the seasoning may be a process in which gases used during a deposition process, that is, the first and second deposition gases, are supplied to the injection part 500 from each of the first and second gas supply parts 200 and 300 in a state in which the substrate 10 is not present inside the chamber 100.

For example, when the first deposition gas including a raw material gas including zinc (Zn), a raw material including indium (In), and a raw material gas including gallium (Ga) is supplied from the first gas supply part 200 to the injection part, and when the second deposition gas including oxygen is supplied from the second gas supply part 300 to the injection part, the first and second deposition gases are injected through the injection part 500.

At this point, a reaction occurs between the first deposition gas and the second deposition gas, and thus, a seasoning thin film, that is, an IGZO may be deposited inside the chamber 100, that is, on the inner wall of the chamber 100 and on the surfaces of the susceptor 600 and the injection part 500.

In addition, when the first deposition gas and the second deposition gas are injected, the RF power supply part 700 is operated and RF power is applied to the injection part 700, so that plasma may be formed inside the chamber 100.

Of course, when injecting the first deposition gas and the second deposition gas, the seasoning may also be performed without forming plasma.

As such, when the protective film is coated to the inside of the chamber 100 and then seasoning is performed before the next deposition process, a metallic raw material that constitutes the protective film, for example, at least one among aluminum (Al), zirconium (Zr), or hafnium (Hf) may be prevented or suppressed from acting as impurities to a deposited film to be deposited in the next deposition process. Accordingly, there may be an effect in that the performance of the thin film transistor is improved and deviation in the performance may be reduced.

The thickness of the seasoning thin film may favorably be no less than approximately 100 Å, and this is because when the thickness is no less than approximately 100 Å, the protective film effectively suppresses performance degradation of the thin film to be deposited in the next deposition process, such as, an IGZO thin film for the active layer.

In addition, the upper limit of the thickness of the seasoning film is not particularly limited, but it may be desirable to set the upper limit to no greater than approximately 1,000 Å to improve the operation efficiency and productivity of the substrate processing apparatus.

When the seasoning process is completed, a substrate 10 which is the next deposition workpiece is loaded into the chamber 100, and the above-mentioned deposition process may be performed.

When the active layer (40) forming process is completed, the substrate is moved to the next process device, the protective film 60 and the source and drain electrodes 50a and 50b are formed, and thus, a thin film transistor is manufactured.

As such, in a chamber cleaning method in accordance with exemplary embodiments, the protective coating process is performed after completing the chamber 100 inside cleaning process is completed. That is, a deposition film that is deposited inside the chamber 100 and includes chlorine (Cl) is coated by the protective film during the cleaning process or after the cleaning process, and thus, a reaction between the deposited film and moisture is prevented. Accordingly, generation of hydrogen chloride (HCl) that is a corrosive matter may be prevented, so that the corrosion of, that is, damage to the inside of the chamber 100 may be prevented.

In addition, a seasoning process may further be performed inside the chamber 100 after the protective film coating. When performing the seasoning process, an atmosphere similar to that during the next deposition process is built inside the chamber 100, so that factors acting as impurities during the deposition process may be reduced and there is an effect of improving thin film characteristics. In addition, there are effects of improving the performance of an element, for example, a thin film transistor is improved, and reducing deviation in performance.

In a chamber stabilizing process in accordance with exemplary embodiments, a protective film coating process is performed in situ after completing a cleaning process inside a chamber.

In the protective film coating process, an internal part inside the chamber and a chamber inside wall surface may be damaged during the chamber cleaning process using a corrosive gas or after the cleaning process.

Thus, reaction after the cleaning process between the parts exposed to corrosion and moisture may be suppressed by performing the protective film coating process. Accordingly, the generation of a corrosive matter, for example, hydrogen chloride (HCl), may be prevented or suppressed, so that the inside of the chamber may be prevented from being corroded, that is, damaged.

In addition, a seasoning process may further be performed in situ inside the chamber after the protective layer coating process. When performing the seasoning process, an atmosphere similar to that during the next deposition process is built inside the chamber 100, so that factors acting as impurities during the deposition process may be reduced and there is an effect of improving characteristics of the thin film generated after completing the protective film coating process and the seasoning process.

In addition, there are effects of improving the performance of an element, for example, a thin film transistor is improved, and reducing deviation in performance In addition, in an exemplary embodiment, the deposition process and the chamber stabilizing process are performed in situ, so that infiltration of impurities into the chamber may be effectively blocked, and thus, corrosion inside the chamber may be more effectively prevented or suppressed.

INDUSTRIAL APPLICABILITY

In accordance with an exemplary embodiment, reaction after the cleaning process between the parts exposed to corrosion and moisture may be suppressed by performing the protective film coating process. Accordingly, the generation of a corrosive matter, for example, hydrogen chloride (HCl), may be prevented or suppressed, so that the inside of the chamber may be prevented from being corroded, that is, damaged.

What is claimed is:

1. A chamber cleaning method comprising a chamber stabilizing process for transporting a substrate, on which a thin film deposition process has been completed, out of a chamber and processing an inside of the chamber, wherein the chamber stabilizing process comprises:
    a cleaning process for injecting a cleaning gas into the chamber and etching and cleaning byproducts generated by the thin film deposition process;
    a coating process for injecting a gas comprising at least one among aluminum (Al), zirconium (Zr) or hafnium (Hf) into the chamber as a coating gas, and generating a protective film on at least one surface of an inner wall of the chamber and components installed inside the chamber; and
    a seasoning process performed for forming a seasoning thin film after the coating process, wherein the seasoning process comprises a process for injecting a deposition gas used in the deposition process.

2. The chamber cleaning method of claim 1, wherein the cleaning gas comprises at least one among chlorine (Cl) or hydrogen (H).

3. The chamber cleaning method of claim 1, wherein the cleaning process comprises a process for generating plasma inside the chamber.

4. The chamber cleaning method of claim 1, wherein the protective film formed by the coating process comprises a metal oxide film.

5. The chamber cleaning method of claim 4, wherein the protective film comprises at least one among an aluminum oxide, a zirconium oxide, or a hafnium oxide.

6. The chamber cleaning method of claim 4, wherein the protective film is formed in a thickness of at least approximately 100 Å.

7. The chamber cleaning method of claim 1, wherein a thickness of the seasoning thin film deposited inside the chamber by the seasoning process is no less than approximately 100 Å.

8. The chamber cleaning method of claim 1, wherein a thin film deposited on the substrate through the deposition process is a metal oxide film.

9. The chamber cleaning method of claim 8, wherein the metal oxide film deposited on the substrate by the deposition process is an active layer of a thin film transistor.

10. The chamber cleaning method of claim 9, wherein upon forming the active layer in the deposition process, the active layer is formed by doping at least one among indium (In) or gallium (Ga) into zinc oxide (ZnO).

* * * * *